United States Patent [19]

Kawai et al.

[11] Patent Number: 5,200,021

[45] Date of Patent: Apr. 6, 1993

[54] METHOD AND APPARATUS FOR VAPOR DEPOSITION

[75] Inventors: Hiroji Kawai; Syunji Imanaga, both of Kanagawa; Ichiro Hase, Tokyo; Kunio Kaneko, Kanagawa; Naozo Watanabe, Tokyo, all of Japan

[73] Assignee: Sony Corporation, Tokyo, Japan

[21] Appl. No.: 267,635

[22] Filed: Oct. 31, 1988

Related U.S. Application Data

[63] Continuation of Ser. No. 158,062, Feb. 12, 1988, abandoned, which is a continuation of Ser. No. 12,448, Feb. 9, 1987, abandoned.

[30] Foreign Application Priority Data

Feb. 15, 1986 [JP] Japan .................................. 61-31100
Feb. 15, 1986 [JP] Japan .................................. 61-31101

[51] Int. Cl.$^5$ .................................. C30B 25/16
[52] U.S. Cl. .................................. 156/601; 156/610; 156/613; 422/108; 422/245; 118/665; 118/688; 118/691
[58] Field of Search ............ 156/601, 610, 613, 614, 156/DIG. 80; 427/10; 437/7; 118/665, 715, 688, 691; 422/108, 245

[56] References Cited

U.S. PATENT DOCUMENTS

| 3,645,623 | 2/1972 | Patten | 118/665 |
|---|---|---|---|
| 3,673,420 | 6/1972 | Ward et al. | 118/665 |
| 3,892,490 | 7/1975 | Uetsuki et al. | 156/601 |
| 4,024,291 | 5/1977 | Wilmanns | 118/665 |
| 4,203,799 | 5/1980 | Sugawara et al. | 156/601 |
| 4,525,376 | 6/1985 | Edgerton | 427/10 |
| 4,582,431 | 4/1986 | Cole | 427/10 |
| 4,931,132 | 6/1990 | Aspnes et al. | 156/601 |

FOREIGN PATENT DOCUMENTS

0101049 2/1984 European Pat. Off. .

OTHER PUBLICATIONS

Patent Abstract of Japan vol. 2, No. 100 referring to JP 53-65,276.
F., Hottier, et al., "In situ monitoring by elliposometry of metalorganic epitaxy or GaAlAs–GaAs superiattice", J. Appl. Phys. 51(3), Mar. 1980.
Esaki et al., IBM Technical Disclosure Bulletin, vol. 13, No. 12, May 1971, pp. 3698–3699.
Kutko, R. "Ellipsometry for Semiconductor Process Control", Solid State Tech., Feb. 1978 pp. 43–44, 47.

*Primary Examiner*—R. Bruce Breneman
*Attorney, Agent, or Firm*—Ronald P. Kananen

[57] ABSTRACT

A method for vapor deposition includes monitoring of growth of a semiconductor layer by way of in-situ monitoring. According to the invention, in-situ monitoring is performed by irradiating a light beam onto the surface of the growing layer in a direction nearly perpendicular to the surface. Growth parameters of the layer are detected by monitoring variation of the light reflected by the surface of the layer. A growth condition in a vapor deposition chamber is feedback controlled based on the detected growth parameter.

13 Claims, 9 Drawing Sheets

FIG. 9
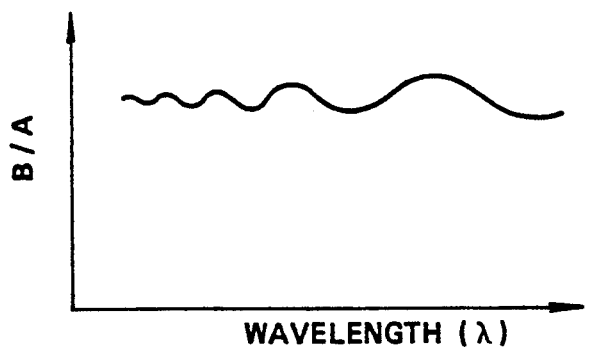
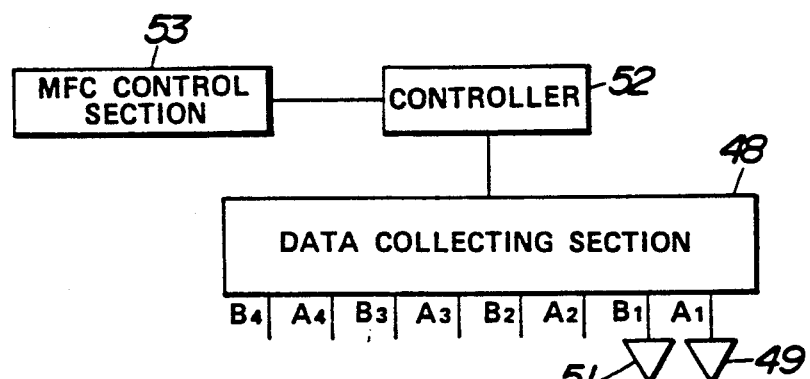
FIG. 10
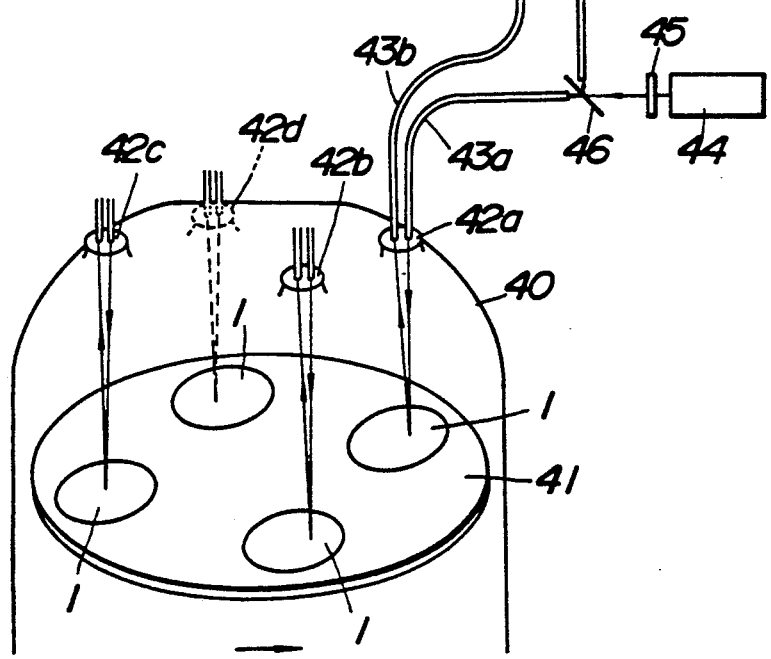

METHOD AND APPARATUS FOR VAPOR DEPOSITION

This application is a continuation of application Ser. No. 0,158,062, filed Feb. 12, 1988, now abandoned, which in turn is a continuation of application Ser. No. 07/012,448, filed Feb. 9, 1987, now abandoned.

BACKGROUND OF THE INVENTION

1. Field of the Invention

The present invention relates generally to a method and system for vapor deposition, such as Metalorganic Chemical Vapor Deposition (MOCVD). More specifically, the invention relates to a method and system for vapor deposition for epitaxial growth of a semiconductor layer, such as a thin compound semiconductor layer, on a substrate.

2. Description of the Background Art

Recently, epitaxial growth of semiconductor layers, such as thin compound semiconductor layers, is regarded as an important technology for producing high efficiency semiconductor devices. This is especially so, since it is not possible in the conventional art to produce semiconductor devices utilizing a hetero-junction, such as laser diode, a high electron mobility field effect transistor (HEFT), a hetero-junction bipolar transistor (HBT), and other AlGaAs system semiconductor devices, except by a vapor deposition process, and especially a MOCVD process.

During an epitaxial growth process, growth parameters, such as composition of grown layer, growth speed and so forth preferably should be monitored by way of so-called "in-situ monitoring". However, it has been difficult to perform in-situ monitoring in the conventional epitaxial growth apparatuses including silicon epitaxial growth apparatuses. Therefore, in-situ monitoring has not been performed in the conventionally available apparatus.

In recent years, there has been proposed a reflecting high electron rays diffraction (RHEED) method to monitor the surface of the layer of AlGaAs grown by a molecular beam epitaxial (MBE) method and as a feedback for the growth apparatus. However the proposed method is not regarded as practically applicable. The reason is that, since, in the MBE method, spatial distribution of a molecular beam flux has a high and unique anisotropy requiring rotation of the substrate in order to obtain uniformity of the semiconductor layer surface, and consequently, vibration or swaying of the substrate caused during rotation makes it difficult to perform in-situ monitoring by the RHEED method in which the electron ray is irradiated at a low angle of a few degrees.

On the other hand, in the J. Appln. Phys. 51(3), pp 1599-1602, published on March, 1980, there has been proposed a method of performing in-situ monitoring by Elipsimetric (diffracting beam analysis) method for monitoring GaAlAs-GaAs super lattice epitaxial growth grown by the MOCVD method. This Elipsometric method monitors layer growth and derives information of the layer thickness and the refraction index of the layer and so forth based on phase data of reflected light, by irradiating polarized light toward the growing layer at a low angle. This method is regarded as effective in performing in-situ monitoring, but involves disadvantages in that:

(1) it requires a polarized light inlet window and a reflected light outlet window in the apparatus strictly limiting the construction of the apparatus;

(2) also, in this method, it demands great accuracy in setting of the incident angle of the incident light requiring troublesome alignment adjustments of the entire arrangement including the angle of the sample set on a heating base;

(3) since the polarized light has a low angle of incidence passing through growing gas for a relatively long distance, a high level of noise due to disturbance by the gas is caused;

(4) any slight change of the sample position or vibration will have a large affect on monitoring; and (5) since the monitoring data is output in the form of phase data, it becomes necessary to utilize a computer for extracting growth parameters therefrom.

SUMMARY OF THE INVENTION

Therefore, it is an object of the present invention to provide a method and apparatus for vapor deposition of semiconductor layers, allowing in-situ monitoring.

In order to accomplish the aforementioned and other objects, a method for vapor deposition, according to the present invention, includes monitoring of growth of a semiconductor layer by way of in-situ monitoring. According to the invention, in-situ monitoring is performed by irradiating a light beam onto the surface of the growing layer in a direction substantially perpendicular to the surface. Growing parameters of the layer can be detected by monitoring variations in magnitude of the light reflected by the surface of the layer. Growth conditions in vapor deposition are feedback controlled based on the detected growing parameter.

According to the invention, an apparatus for implementing the vapor deposition method set forth above is also provided.

According to one aspect of the invention, a method for controlling growth and composition of a thin layer grown by means of vapor deposition, comprises the steps of:

irradiating light beams onto the surface of the thin layer with an incident angle substantially at a right angle with respect to the thin layer surface;

receiving a light beam reflected from the thin layer for monitoring growth parameters and producing a growth parameter indicative signal; and feedback controlling growing conditions of the thin layer based on the growth parameter indicative signal.

In the preferred method, a growth parameter is derived on the basis of the intensity of the light beam reflected by the thin layer. Preferably, the growth parameter is a refraction index to be derived on the basis of the intensity of the reflected light beam. In the alternative, the growth parameter is the composition of the thin layer or is the relative intensity of the reflected light with respect to the intensity of the light beam irradiated onto the thin layer. The relative intensity of the reflected light with respect to the intensity of the light beam to be irradiated is variable depending upon wavelength of the light beam irradiated.

In practice, the thin layer is formed on a substrate which is mounted on a susceptor which has a slightly inclined mounting surface. The susceptor is rotatable about a center axis thereof at a given constant speed. The substrate on the susceptor is cyclically irradiated by the light beam for reflecting the light beam at an intensity variable depending upon variation of the growth parameter. The growing condition is adjusted by adjusting the flow rate of a reaction gas.

According to another aspect of the invention, an apparatus for vapor deposition for forming a thin layer comprises first means for defining a reaction chamber, through which a controlled amount of a reaction gas flows, second means for irradiating a light beam on to the growing layer at an incident angle near to a right angle with respect to the surface of the growing layer, third means for receiving the light beam reflected by the growing layer for producing a signal indicative of the intensity of the reflected light beam, fourth means for deriving growth parameters of the thin layer based on the reflected light beam indicative signal, and fifth means for controlling growing conditions of the thin layer on the basis of the growth parameter so that the growth parameter coincides with a predetermined value.

Preferably, the fourth means derives a thickness of the thin layer based on the reflection indicative signal value, a refraction index of the thin layer, or relative reflected light intensity relative to a reference light intensity for detecting composition of the thin layer. In case that the fourth means derives the relative reflected light intensity, the fourth means derives the reference light intensity based on the reflected light intensity measured in advance of starting deposition of the thin layer. In the alternative, the fourth means derives the reference light intensity based on the light intensity of the light beam to be irradiated onto the thin layer.

The thin layer is grown on a substrate by way of metalorganic chemical vapor deposition, and the reference light intensity is derived on the basis of the reflected light intensity measured with respect to the substrate.

Preferably, the thin layer is grown on a substrate mounted on a susceptor disposed within the reaction chamber, by way of metalorganic chemical vapor deposition, the susceptor is rotatable with the substrate about a central rotary axis at a given speed to align the substrate to the second means at a given angular position during rotation. The second means comprises a plurality of light beam sources for irradiating a light beam at nearly right angles with respect to the surface of the substrate, each of the light beam sources being arranged to be aligned with the substrate at a predetermined angular position of the susceptor.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings:

FIG. 9 is a graph showing a reflected light intensity ratio (b/a) with respect to wavelength ($\lambda$);

FIG. 10 is a fragmentary illustration of a third embodiment of an apparatus for performing MOCVD method according to the invention;

DESCRIPTION OF THE PREFERRED EMBODIMENT

Figure 1:
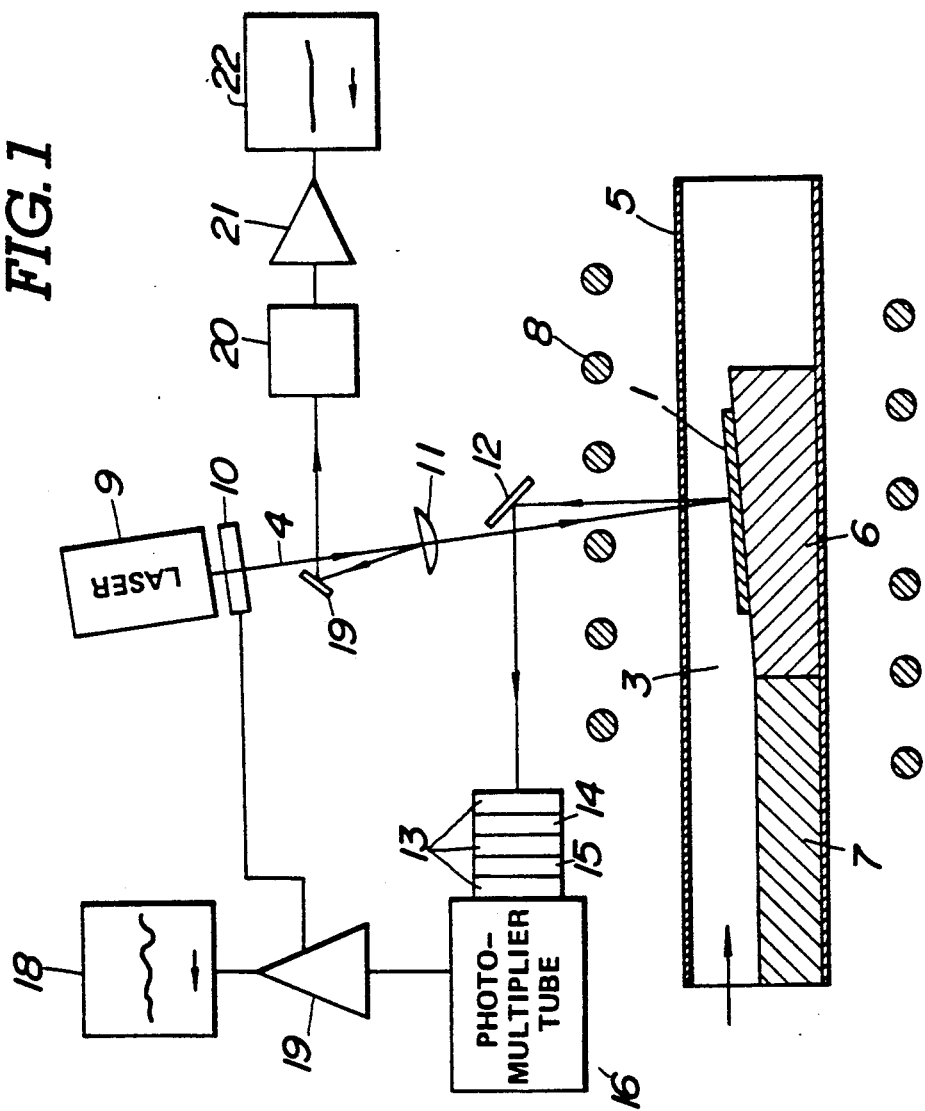
FIG. 1 is a fragmentary illustration of the preferred embodiment of an apparatus for performing a MOCVD method for growing a semiconductor layer on a substrate and for performing in-situ monitoring for feedback controlling growth conditions.
Figure 2:
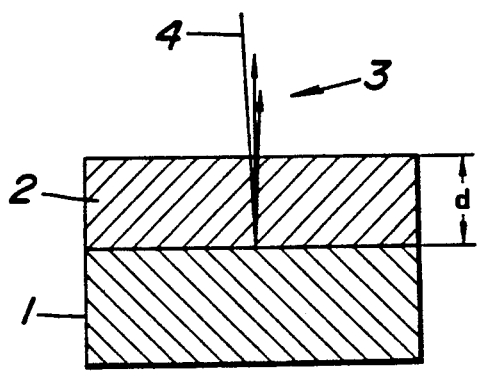
FIG. 2 is an enlarged section of the semiconductor substrate and the semiconductor layer growing on the substrate, which is utilized for discussion of principle of the invention.

Referring now to the drawings, particularly to FIG. 1, the first embodiment of an apparatus performs a MOCVD method for growing a semiconductor layer 2 on a substrate 1. The substrate 1 is disposed within a crystal reaction tube 5 and is mounted on a susceptor 6 disposed within the internal space of the reaction tube 5. The susceptor 6 is made of carbon, for example, and has a inclined or skewed support surface to support the substrate 1 thereon. At the axial upstream end of the susceptor 6, a base 7 is disposed within the reaction tube 5 in alignment to the susceptor 6. The base 7 has a height corresponding to the height of the susceptor 6 at the end mating with the base 7.

The reaction tube 5 is surrounded by an RF coil 8. The RF coil 8 is adapted to heat the substrate 1 at a predetermined temperature. A growing gas or reaction gas is introduced into the reaction tube 5 and flows through the reaction tube as shown by an arrow A. By this process, a thin layer 2 is grown on the surface of the substrate 1.

The MOCVD apparatus also incorporates a system for monitoring the growth parameters of the layer and feedback controlling the growth conditions. The system includes a light source 9. The light source 9 is positioned at a given distance from the reaction tube 5. In the shown embodiment, He-Ne a laser is employed as the light source. The He-Ne laser 9 generates a laser beam 4 of a wavelength ($\lambda$) of 6328 Å. The laser beam 4 emitted from the laser 9 passes through a chopper 10, a lens 11 and a crystal wall of the reaction tube 5 to irradiate the surface of the substrate 1. The lens 11 employed in the shown embodiment preferably has a focal distance of 500 mm.

The laser beam 4 is then reflected by the substrate 1, The reflected laser beam is diffracted by means of a reflective mirror 12 to irradiate a photomultiplier tube 16 through a diffusion plate 13, a neutral density (ND) filter 14 and a color filter 15. In the shown arrangement, the diffusion plate 13, the ND filter 14 and the color filter 15 are piled onto each other. The ND filter 14 is so designed as to absorb the reflected laser beam. On the other hand, in the preferred construction, the color filter 15 is selected to pass the light over the wavelength of 600 nm.

The photomultiplier tube 16 is adapted to detect the reflected light. The photomultiplier tube 16 is connected to a lock-in amplifier 17. The lock-in amplifier 17 is also connected to the chopper 10. The lock-in amplifier 17 is thus cooperative with the chopper 10 to pass only the photomultiplier tube output generated in response to the laser beam selected by the chopper to a recorder 18. The recorder 18 receives the output of the photomultiplier tube 16 for recording variations of reflected light intensity with respect to the growth period on a chart.

In the preferred embodiment, a component of the laser beam 4 passing the chopper 10 is reflected by the flat surface of the lens 11. The light component reflected by the lens 11 is diffracted by means of a reflective mirror 19 towards a power meter 20. The output of the power meter 20 is connected to a recorder 22 through an amplifier 21. The recorder 22 records variations in the intensity of the light reflected by the lens with respect to the growth period. In order to maintain accuracy of monitoring results, in a preferred embodiment, the value recorded in the recorder 18 is divided by the value recorded in the recorder 22 for a mutually corresponding growth period. Therefore, fluctuations of the intensity of the laser beam will never affect the monitoring results.

With the apparatus as set forth above, the principle of the invention will be discussed hereafter in order to facilitate a better understanding of the invention. For discussing the principle of the invention, it is assumed that the semiconductor layer 2 to be formed on the substrate 1 has a thickness of d and that the substrate is placed within a reaction gas atmosphere 3. The light of the wavelength $\lambda$ is irradiated on to the surface of the semiconductor layer 2 in a substantially perpendicular direction to the surface of the layer. The Fresnel's reflection coefficient at the borders between the layer 2 and the reaction gas 3 and between the layer 2 and the substrate 1 can be illustrated by the following formulae:

$$r_1 = \frac{n_1 - n_2}{n_1 + n_2} \quad (1)$$

$$r_2 = \frac{n_2 - n_3}{n_2 + n_3} \quad (2)$$

where $n_j$ (j=1, 2, 3) is a complex refractive index of a material j and can be illustrated by:

$$n_j = n_j - iK_j \quad (3)$$

where $n_j$ is a real number component of $n_j$, and $k_j$ is $(4\pi/\lambda)\cdot\alpha_j$ ($\alpha_j$ is an absorption coefficient of the material j).

Here, in consideration of overlapping reflection, the composite reflection coefficient R can be illustrated by:

$$R = \frac{r_2 + r_1 \exp(-i\delta)}{1 + r_1 r_2 \exp(-i\delta)} \quad (4)$$

$$\delta = (4\pi/\lambda) n_2 d \quad (5)$$

Therefore, the measured reflection intensity becomes $|R|^2$. From the foregoing formulae (4) and (5), it would be appreciated that the reflection intensity varies cyclically as d increases. Assuming m=1, 2, 3 ..., the following formula is derived from the formulae (4) and (5):

$$n_2 d = \begin{bmatrix} (\lambda/4)(2m + 1) & : \text{lower peak} \\ (\lambda/4)(2m) & : \text{upper pack} \end{bmatrix} \quad (6)$$

Figure 3:
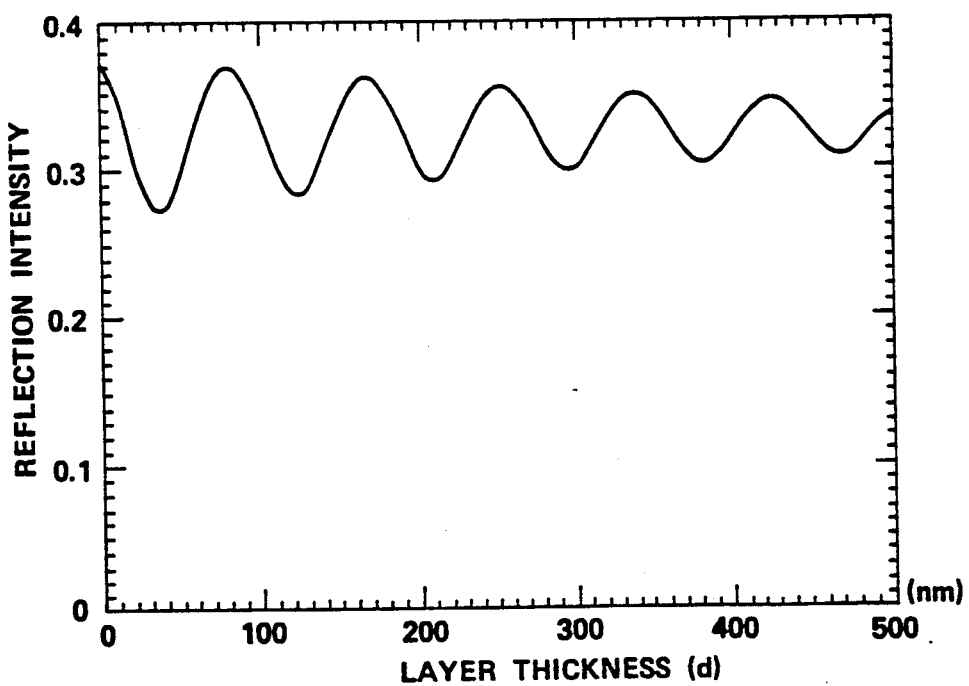
FIG. 3 is a graph showing variation of intensity of a reflected light in relation to the thickness of the semiconductor layer.
Figure 4A:
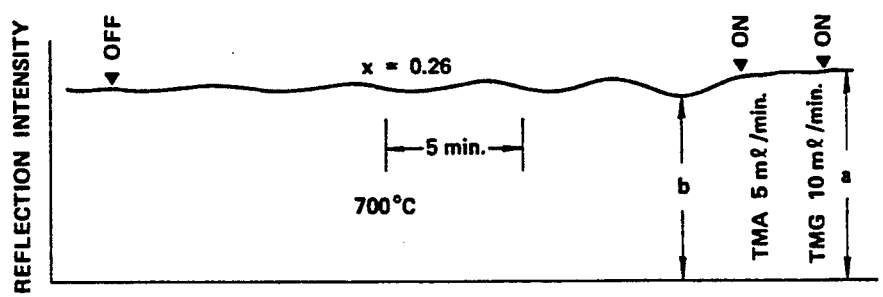
FIGS. 4(A), 4(B), 4(C) and 4(D) are graphs showing variation of intensity of reflected light with respect to growth period.
Figure 4B:
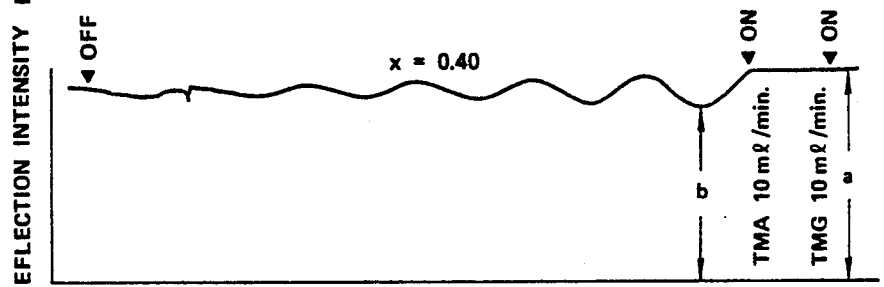
Figure 4C:
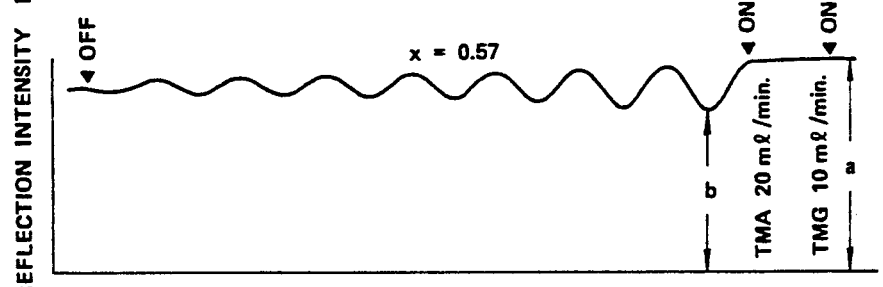
Figure 4D:
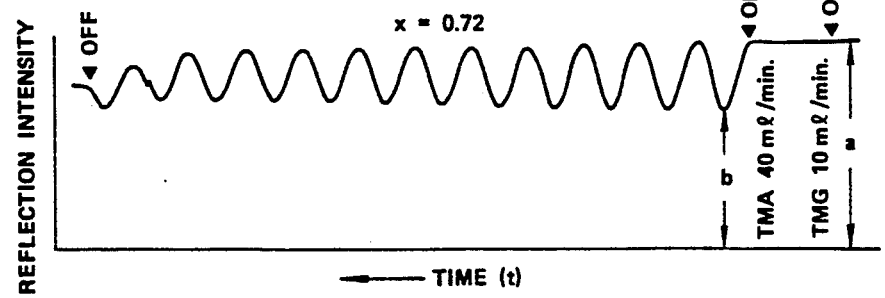

FIG. 3 shows a result of an experimentally performed calculation utilizing the foregoing formula (4) with respect to thin semiconductor layer of $Al_xGa_{1-x}As$ (x=0.57). For performing calculation, it is assumed that $n_1=4.11$, $\alpha_1=81800$ cm$^{-1}$, $n_2=3.66$, $\alpha_2=24200$ cm$^{-1}$, $n_3=1$, $\alpha_3=0$. As will be seen from FIG. 3, when a cyclical variation of the reflected light intensity according to growing magnitude d of the layer 2 is observed by irradiating the laser beam 4 with an incident angle substantially perpendicular to the surface of the layer, the complex refraction index $n_2$ of the growing layer, which represents composition of the layer, can be obtained.

Based on the principle set forth above, an experiment is performed for growing an AlGaAs semiconductor layer on a GaAs substrate. In the experiment, the GaAs substrate 1 in the reaction tube 5 is heated to a temperature of 700° C. by means of the RF coil 8. As a Ga containing material and Al containing material, trimethylgallium (TMG) and trimethylalminium (TMA) are used. TMG flows through the reaction tube 5 in a fixed flow amount, i.e. 10 ml/min. On the other hand, the flow amount of TMA is varied at 5 ml/min, 10 ml/min, 20 ml/min, 40 ml/min. In addition, in order to avoid accumulation of reactant within the reaction tube, which tends to interfere with the laser beam A, a relatively high speed flow velocity of the reaction gas is selected, e.g. higher than 1 m/sec.

The results of measurements of the reflected light intensity are shown in FIG. 4. The Al composition x in the grown semiconductor layer of $Al_xGa_{1-x}As$ was measured based on photoluminescence. From this, it is apparent that the Al composition x is variable depending upon the flow amount of TMA. Namely, in the aforementioned experiment, the Al compositions x with respect to flow amount of TMA are 0.26, 0.40, 0.57 and 0.72. On the other hand, after growing to the thickness d, the $Al_xGa_{1-x}As$ layer 2 was measured by means of scanning-type electron microscope (SEM). Based on the measured d, the refraction index of the layer was derived according to the foregoing formula (6). Furthermore, the absorption coefficient $\alpha_2$ was also derived based on the absorption rate of the reflected light intensity according to the following formula:

$$I = I_0 \exp(-\alpha_2 \cdot d)$$

where $I_0$ is reflection light intensity at the layer thickness 0,

I is reflection light intensity at the layer thickness d.

The results are shown in the following table. It should be noted that the data with respect to GaAs shown in the table is obtained from vibration analysis of a curve of reflection light intensity when AlAs is grown on GaAs substrate and subsequently GaAs is grown on the AlAs layer.

| | Refraction Index and Absorption Coefficient at 6328Å | | | | | | |
|---|---|---|---|---|---|---|---|
| | Temperature | | $Al_xGa_{1-x}As$ | | | | |
| | (°C.) | GaAs | x = 0.26 | x = 0.40 | x = 0.57 | x = 0.72 | AlAs |
| Refraction Index | 600 | | | | 3.70 | | 3.37 |
| | 700 | 4.11 | 3.94 | 3.86 | 3.66 | 3.48 | 3.38 |
| | 800 | | | | 3.79 | | 3.42 |
| Absorption Coefficient ($cm^{-1}$) | 600 | | | | $2.42 \times 10^4$ | | |
| | 700 | $8.18 \times 10^4$ | $4.94 \times 10^4$ | $3.70 \times 10^4$ | $2.42 \times 10^4$ | $5.85 \times 10^3$ | 0 |
| | 800 | | | | $4 \times 10^4$ | | |

Figure 5:
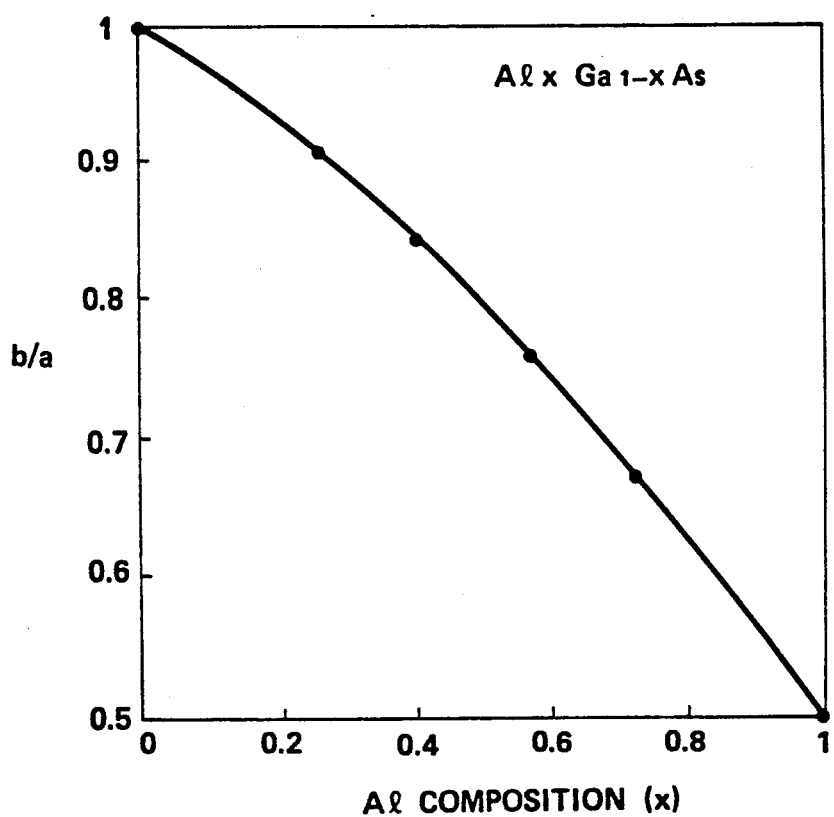
FIG. 5 is graph showing relationship between the composite ratio (x) of Al in $Al_xGa_{1-x}$ forming the semiconductor layer, and reflected light intensity ratio (b/a)

Based on the results set out above, a process for deriving growth parameters during growing of the layer 2 may be discussed herebelow. FIG. 5 plots a ratio (b/a) of reflected light intensity b at the first trough in the wave form depicted in FIG. 3 versus the reflected light intensity a of the GaAs substrate 1, in relation to the Al composition x. Utilizing the graph of FIG. 5 and based on the reflected light intensity at the first trough of the wave pattern, the Al composition x of the growing $Al_xGa_{1-x}As$ can be obtained. The first trough of the wave pattern corresponds approximately to the layer thickness of 40 nm.

Figure 6:
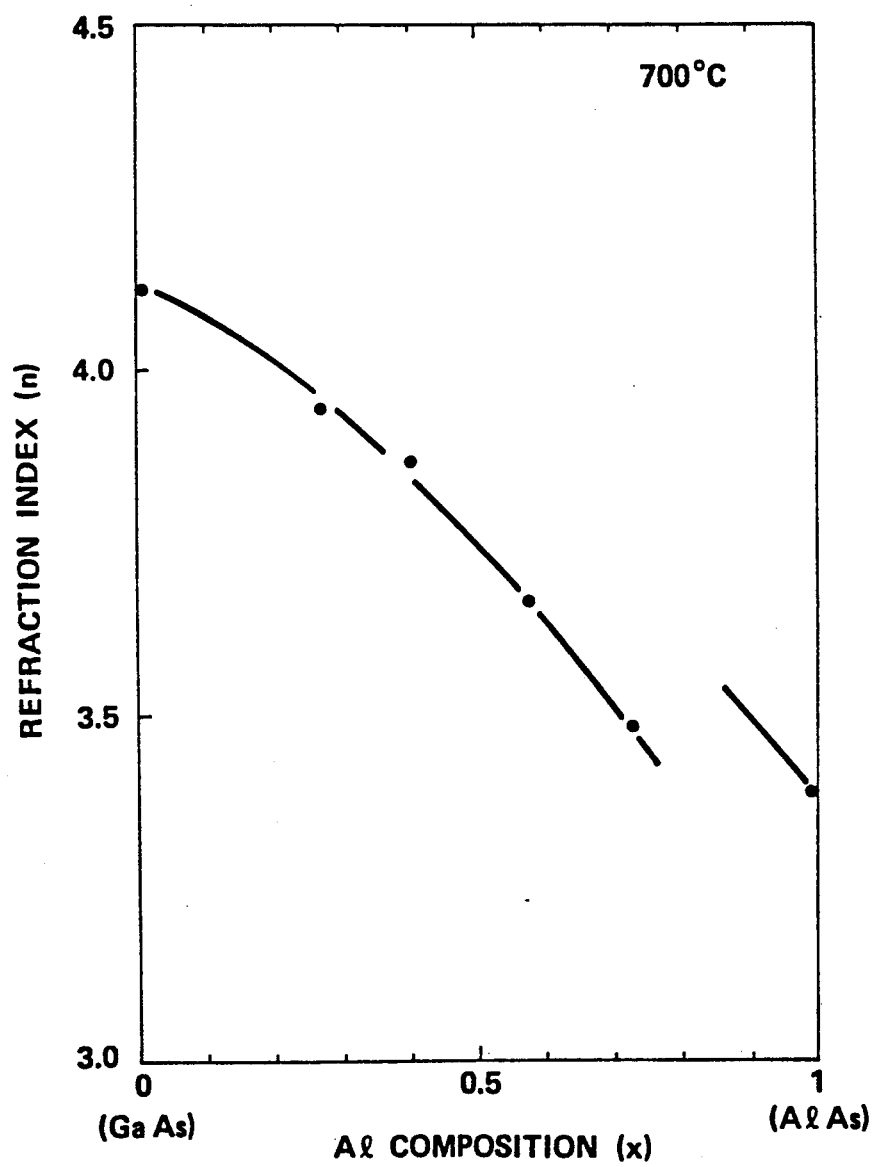
FIG. 6 is graph showing relationship between the composite ratio (x) of Al in $Al_xGa_{1-x}$ As forming the semiconductor layer, and refractive index (n)

FIG. 6 is a graph corresponding to the foregoing table. In FIG. 6, the refraction index n becomes discontinuous around the Al composition x of 0.8. This is caused due to presence of a band-gap in $Al_xGa_{1-x}As$. Since the Al composition x can be derived from FIG. 5, the refraction index n can be derived utilizing the graph of FIG. 6. Accordingly, by utilizing the derived refraction index, and according to the formula (6) set forth above, the layer thickness at the trough in the wave pattern representing the reflected light intensity can be derived. By dividing this thickness by growth period to the first trough of the wave pattern, growing speed of the layer can be derived. After once establishing an analytical curve based on the graphs of FIGS. 5 and 6 and based on the formula (6), measurements can be performed directly by utilizing the analytical curve.

Since in-situ monitoring for growth speed and Al composition x of an $Al_xGa_{1-x}As$ thin layer in a growing process becomes possible in the shown embodiment, feedback control for the MOCVD apparatus is possible. In feedback control, data indicative of the growth parameters, such as growth speed, Al composition and so forth, is fedback to a mass flow controller (MFC) of the MOCVD apparatus. By this, when the growth parameter indicates a value unacceptably different from a desired value, concentration of the reaction gas is adjusted. Therefore, growth of the semiconductor layer can be precisely and successfully controlled.

When an incident angle of the laser beam 4 fluctuates, error may occur in the results of the measurement. Namely, when the laser beam 4 is at an angle other than 90° with respect to the layer 2, the length of an optical path of the laser beam through the layer 2 expands shortening the interval of interference. For instance, when the optical path length expands at 1%, the interval of interference may be shortened by 1%. In this case, assuming the $n_2$ of the AlGaAs layer 2 is 3.5, the incident angle can be derived according to Snell's law. Namely, the incident angle of the laser beam 4 can be illustrated by the following formula:

$$n_3 \sin \theta = n_2 \sin \theta'$$

where $\theta$ is the angle of incidence;
$\theta'$ is the refraction angle;

$n_3$ is refraction index (=1) of the gaseous phase.
Here, when $\cos \theta'$ is 0.99, the refraction angle $\theta'$ is derived herefrom as 8°. Therefore, the incident angle $\theta$ can be illustrated by:

$$\theta = \sin^{-1}(3.5 . \sin 8°) = 30°$$

As will be appreciated herefrom, even when the incident angle fluctuates at 30°, the error in the measurement results may be approximately 1%. This is significantly smaller than that in Elipsometric method. Furthermore, according to the shown embodiment, the laser beam and the reflected beam pass through a common window provided in the reaction tube 5; thus, construction limitations of the apparatus are reduced. In addition, since the reflected light intensity and the optical path length will not be significantly affected by small changes in the angle of incidence of the laser beam, it is not necessary to accurately and precisely adjust the axis of the laser beam. Additionally, in the shown embodiment, since the optical path length of the laser beam through the reaction gas can be shortened in comparison with that in the Elipsometric method, noise due to disturbance of the reaction gas can be reduced.

Figure 7:
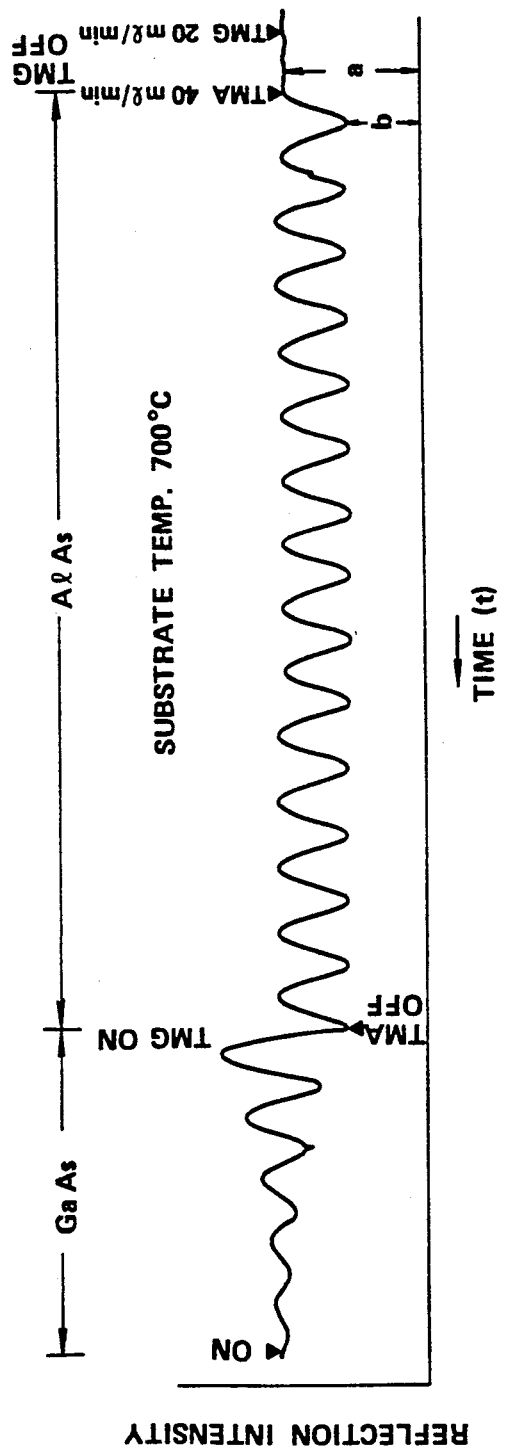
FIG. 7 is a graph showing variations of reflected light intensity during growth of multiple layers with respect to a growth period.

FIG. 7 shows variation of the reflected light intensity in another experimentation utilizing the MOCVD apparatus of FIG. 1. In the experiment, first a GaAs layer was grown on the GaAs substrate by flowing TMG at a flow rate of 20 ml/min. Thereafter, on the grown GaAs layer, an AlAs layer is grown by flowing TMA at a flow rate of 40 ml/min. As will be observed from FIG. 7, the vibration curve appearing during the growing process of AlAs is distinct from that during growing process of GaAs. Therefore, the monitoring method as set out with respect to the foregoing experiment is applicable for monitoring growth of multiple layers. Therefore, by feeding back the growth parameter derived from monitoring growing conditions to MFC of the MOCVD apparatus, composition of the semiconductor layer to be grown and growing speed can be controlled.

Figure 8:
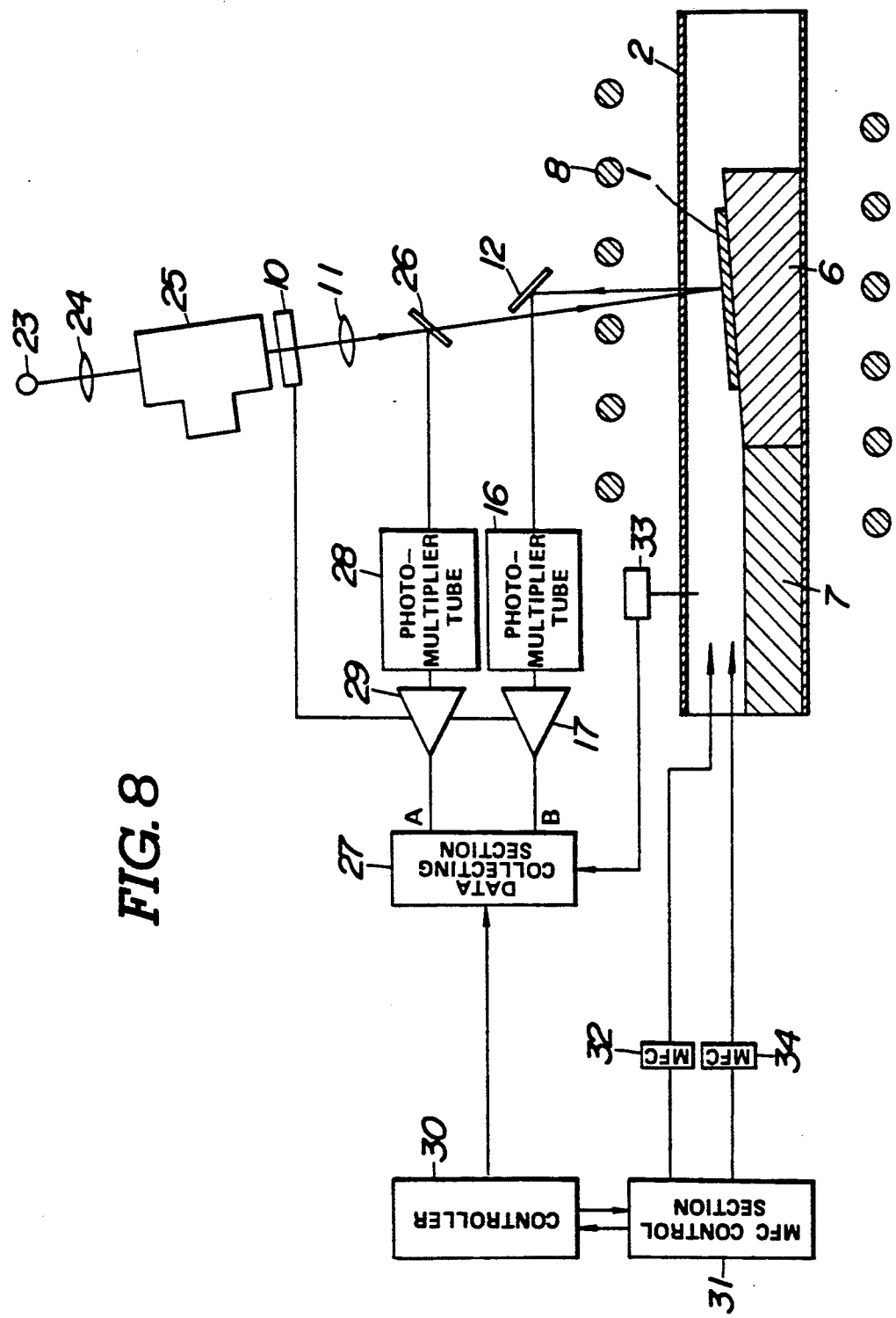
FIG. 8 is a fragmentary illustration of another embodiment of an apparatus for carrying out MOCVD operations.
Figure 11:
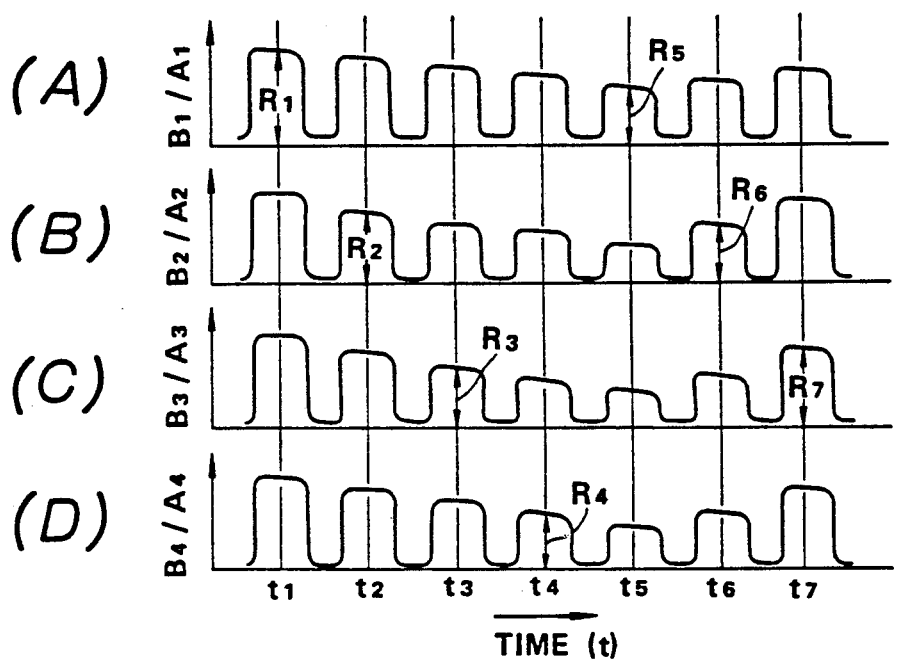
FIGS. 11(A), 11(B), 11(C) and 11(D) are charts showing variations of reflected light intensity monitored through different optical windows.
Figure 12:
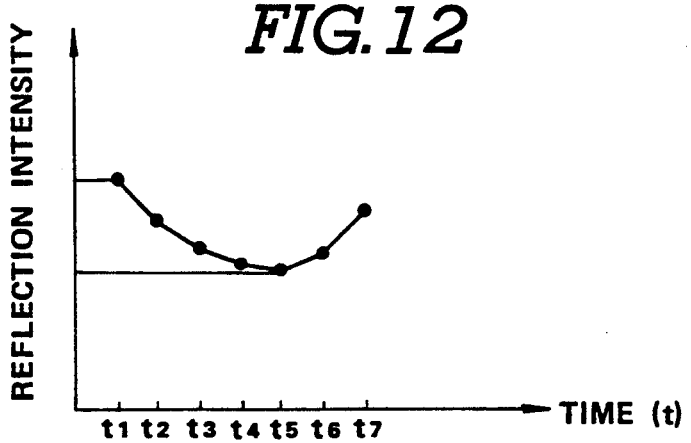
FIG. 12 is a graph showing variation of reflected light intensity with respect to growth period.

FIG. 8 is another embodiment of an apparatus for implementing a MOCVD process and implementing the preferred vapor deposition method according to the invention. In the following disclosure, the elements common to those of the former embodiment of FIG. 1 will be represented by the same reference numerals. In the shown embodiment, a white light source 23 is employed as light source and as a replacement of the laser in the former embodiment. The light emitted from the light source 23 illuminates a high speed scanning photospectroscope 25 through a lens 24. The high speed scanning photospectroscope 25 employed in the shown embodiment is selected to perform high speed scanning at an speed high enough to have a satisfactorily short scanning interval so that the variation of thickness of the semiconductor layer due to growing on the substrate 1 is substantially small and can be ignored during the scanning interval. At present, high speed scanning photospectroscopes which can perform one cycle of scanning operation within a scanning period less than 1 sec, are available on the market. Therefore, the shown embodiment employs one of such high speed scanning photospectroscopes. The spectrum light beam from the photospectroscope 25 passes the chopper 10, the lens 11, a beam splitter 26 and the peripheral wall of the reaction tube 5 to irradiate onto the substrate 1 on the susceptor 6. Similar to the foregoing first embodiment, the incident angle of the light beam to be irradiated onto the substrate 1 is approximately 90° relative to the surface of the substrate. The light beam reflected by the substrate 1 or the semiconductor layer growing on the substrate is deflected by means of the deflector mirror 12 to be received by a photomultiplier tube 16. The photomultiplier 16 outputs a light intensity indicative signal representative of the intensity of the received light beam and feeds the light intensity indicative signal to a data collecting section 27 through the amplifier 17. As in the foregoing first embodiment, the amplifier 17 comprises a lock-in amplifier and is so cooperated with the chopper to be controlled in operation. Specifically, the amplifier 17 passes only output signals of the photomultiplier 16 generated with respect to the light beam selected by the chopper.

On the other hand, the light beam component split by means of the beam splitter 26 is received by means of another photomultiplier tube 28. The photomultiplier 28 also outputs a light intensity indicative signal representative of the intensity of the received light beam component and feeds the light intensity indicative signal to the data collecting section 27 through an amplifier 29. Similarly to the amplifier 17, the amplifier 29 comprises a lock-in amplifier and is so cooperated with the chopper as to be controlled in operation. Specifically, the amplifier 29 passes only output signals of the photomultiplier 28 generated with respect to the light beam selected by the chopper.

The data collecting section 27 is connected to a pressure sensor 33 designed for monitoring pressure in the reaction tube. The pressure sensor 33 produces a pressure indicative signal indicative of the pressure in the reaction tube. The data collecting section 27 is also connected to a computer based controller 30. On the other hand, the controller 30 is connected to an MFC control section 31. The MFC control section 31 is controllably connected to MFC 52 for controlling an amount of the reaction gas to flow through the reaction tube 5 and MFC 34 for controlling the flow rate of a carrier gas. The controller 30 derives a carrier gas flow control signal based on the value of the pressure indicative signal from the pressure sensor 33 so as to maintain the pressure in the reaction tube 5 at a desired value. The MFC control section 31 thus operates the MFC 34 for adjusting the carrier gas flow rate. On the other hand, the controller 30 receives the light intensity indicative signal from the photomultiplier 16 through the amplifier 17 for deriving the reaction gas supply amount. Based on the derived reaction gas flow amount, the controller derives a reaction gas flow control signal. The MFC control section 31 thus operates the MFC 32 to adjust the amount of reaction gas flowing through the reaction tube 5.

The operation of the third embodiment of the MOCVD apparatus with monitoring of growth parameters will be described herebelow. At first, the controller 30 outputs the reaction gas flow control signal to the MFC control section 31 to operate the MFC 32 to flow a predetermined amount of reaction gas through the reaction tube 5. At the same time, the high speed scanning photospectroscope 25 is activated to start a scanning operation. By starting operation of the photospectroscope 25, the light beam through the photospectroscope 25, the chopper 10, the lens 11, and the beam splitter 26 scans on the substrate 1 and the semiconductor layer growing on the substrate. The light beam reflected by the surface of the growing semiconductor layer is deflected by the deflector mirror 12 to irradiate the photomultiplier tube 16. The light intensity indicative signal is thus output from the photomultiplier tube 16 and input to the data collecting section 27 through the lock-in amplifier 17. At the same time, the photomultiplier tube 28 receives the light beam component split by the beam splitter 26 to output the light intensity indicative signal. The light intensity indicative signal of the photomultiplier tube 28 is input to the data collecting section 27 through the lock-in amplifier 29. Assuming the value of the light intensity indicative signal of the photomultiplier tube 16 is A and the value of the light intensity indicative signal of the photomultiplier tube 28 is B, the reflection intensity (B/A) as a coefficient of light beam wavelength $\lambda$, varies as shown in FIG. 9. The reflection intensity data (B/A) is also stored in the data collecting section 29 and analysed by the controller 30. Based on the results of the analysis, the controller 30 produces the reaction gas flow control signal to control MFC 32 through the MFC control section 32. Therefore, the reaction gas flow amount through the reaction tube 5 is controlled to adjust composition of the growing semiconductor layer and speed of growth. Therefore, the growth condition of the semiconductor layer can be feedback controlled based on the reflection intensity data as a coefficient of the wavelength $\lambda$ of the scanning light beam by in-situ monitoring.

FIG. 10 is the third embodiment of a MOCVD apparatus according to the present invention. As will be seen from FIG. 10, this embodiment is applied to a vertical-type MOCVD apparatus. The apparatus includes a bell jar 40 and a disk-shaped susceptor 41. A plurality of substrates 1 are mounted on the susceptor 41. Though it is not clearly shown in the drawing, the susceptor 41 is rotatably associated with a drive shaft (not shown) for rotation within a bell jar 40. It should be appreciated that the shown MOCVD apparatus of FIG. 10 has a heating device and a reaction gas induction system which are arranged in per se well known manner.

The bell jar 40 is formed with optical windows 42a, 42b, 42c and 42d around the top thereof. In the preferred embodiment, the optical windows 42a, 42b, 42c and 42d are formed of transparent quartz material. These optical windows 42a, 42b, 42c and 42d are radially arranged at positions corresponding to the positions of the substrates 1 on the susceptor 41 and are circumferentially arranged at regular intervals. Furthermore, the surfaces of the optical windows 42a, 42b, 42c and 42d are formed to be optically flat so as not to cause diffusion of the incident light beam and reflected light. Pairs of optical fibers 43a and 43b are connected to respective optical windows 42a, 42b, 42c and 42d for irradiating light beams onto the substrates 1 and on the susceptor 41 and receiving the reflected light. Each optical fiber 43a is arranged in order to receive a light beam from the laser 44 as the light beam source through the chopper 45 and the beam splitter 46. Similarly to the foregoing second embodiment, the beam splitter 46 splits the light beam from the laser 44 to feed the split light component to the photomultiplier tube 47. The photomultiplier tube 47 outputs the light intensity indicative signal to feed the same to the data collecting section 48 through the lock-in amplifier 49.

On the other hand, the light beam from the laser passes through optical fiber 43a to be irradiated onto the surface of the substrate 1 or the semiconductor layer growing on the substrate through the optical window 42a, 42b, 42c and 42c. The reflected light from the substrate 1 is received by the optical fiber 43b and fed to the photomultiplier tube 50. The photomultiplier tube 49 produces the reflected light intensity indicative signal to be fed to the data collecting section 48 through the lock-in amplifier 51.

In the practical in-situ monitoring for feedback controlling reaction gas flow amount by means of the controller 52 and the MFC control section 53, the light beams from the lasers 44 are constantly irradiated through the optical windows 42a, 42b, 42c and 42d. Since the susceptor 41 is designed not to reflect the irradiated light beam, the light beam can be detected only when the light beam is irradiated onto one of the substrates 1. Therefor, during one cycle of rotation of the susceptor 41, the substrate 1 opposes respective optical windows 42a, 42b, 42c and 42d in sequential order. While one of the substrates 1 opposes one of the optical windows 42a, 42b, 42c and 42d, the light beam from the laser 44 is reflected by the substrate and received by the optical fiber 43b. Based on the data collected in the data collecting section, the reflection intensity (B/A) is derived as the coefficient of the wavelength $\lambda$. The controller 42 thus produces the reaction gas flow control signal for controlling the reaction gas flow rate through the MFC control section 53.

In the practical operation, the susceptor 41 is driven at a rotation speed of 20 r.p.m. to 30 r.p.m. The laser 44 employed in the shown embodiment is a He-Ne laser and generated laser beam of the wavelength $\lambda$ of 6328 Å. During the semiconductor layer growth period, the reflected light intensity indicative signals are cyclically produced by respective photomultiplier tubes 50 which are connected to corresponding optical windows 42a, 42b, 42c and 42d through the optical fibers 43b, as shown in FIGS. 12(A), 12(B), 12(C) and 12(D). Assuming one of the substrates on the susceptor 41 is placed in alignment with the optical window 42a at a time $t_1$, the same substrate is positioned in alignment with respective optical windows 42b, 42c and 42d at times $t_2$, $t_3$ and $t_4$. The reflection intensities $R_1$ ($B_1/A_1$), $R_2$ ($B_2/A_2$), $R_3$ ($B_3/A_3$) and $R_4$ ($B_4/A_4$) are obtained at respective times $t_1$, $t_2$, $t_3$ and $t_4$. After $t_4$, the same substrate 1 is again placed in alignment with the optical window 42a at a time $t_5$, with the optical window 42b at a time $t_6$. and with the optical window 42c at a time $t_7$. The reflection intensities $R_5$ ($B_1/A_1$), $R_6$ ($B_2/A_2$) and $R_7$ ($B_3/A_3$) are obtained at respective times $t_5$, $t_6$ and $t_7$. Therefore, the variation of the one substrate can be illustrated as shown in FIG. 13.

Based on this, and utilizing the process as set out with respect to FIGS. 4 and 5, the growth parameter of the growing semiconductor layer can be derived.

While the present invention has been disclosed in terms of the preferred embodiment in order to facilitate a better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

For example, it would be possible to formulate various feedback control systems for controlling growth parameters during a growth period of the thin semiconductor layer. In addition, it would be possible to obtain higher accuracy in the first embodiment, by taking the refraction index, Al composition x and the growing speed at the first lower peak of the curve representative of the variation of the reflected light intensity, as initial parameters and by performing derivation of the instantaneous growth parameters, such as refraction index, Al composition and growing speed, based on the initial parameters and the instantaneous reflection intensity measurement.

What is claimed is:

1. A method for controlling growth and composition of a thin layer grown by means of vapor deposition, comprising the steps of:

irradiating a light beam onto the surface of the thin layer which is formed on a substrate mounted on a susceptor which has a slightly inclined mounting surface wherein said susceptor is rotated about a center axis thereof at a given constant speed, with an incident angle substantially at a right angle with respect to the thin layer surface, wherein said substrate on said susceptor is cyclically irradiated by the light beam;

receiving a light beam reflecting from the thin layer for monitoring growth parameters and producing a growth parameter indicative signal based on said reflected beam compared to a reference beam; and feedback controlling growing conditions of the thin layer based on said grown parameter indicative signal.

2. A method as set forth in claim 1, wherein said growth parameter indicative signal is derived on the basis of the intensity of the light beam reflected by said thin layer.

3. A method as set forth in claim 2, wherein one of said growth parameters is the refractive index and said refractive index is determined from said intensity of the reflected light beam.

4. A method as set forth in claim 2, wherein one of said growth parameters is the composition of said thin layer.

5. A method as set forth in claim 2, wherein one of said growth parameters is the relative intensity of said reflected light with respect to the intensity of the light beam irradiated onto said thin layer.

6. A method as set forth in claim 5, wherein said relative intensity of the reflected light with respect to the intensity of the light beam to be irradiated is variable depending upon wavelength of the light beam irradiated.

7. A method as set forth in claim 1, wherein said growing condition is adjusted by adjusting flow rate of a reaction gas.

8. A vapor deposition apparatus for forming a thin film of material on a substrate comprising:

a light source for emitting a beam of light of a predetermined frequency;

sensing means for sensing the intensity of light reflected from a surface of said substrate;

rotatable mounting means whereon said substrate may be disposed;

vacuum chamber means wherein said rotatable mounting means is disposed for defining a chamber in which a vapor deposition process is performed for forming said film of material; and a window formed at a portion of said vacuum chamber through which window light from said light source is introduced into said chamber so as to irradiate a portion of said sample and wherethrough a portion of said light reflected from the irradiated portion of said substrate can pass so as to be directed to impinge upon said sensing means wherein said mounting means is formed of a substantially non-reflecting material and wherein said light is constantly emitted by said source towards a fixed position relative to said rotatable mounting means so that upon rotation of said rotatable mounting means at a constant rate said light beam impinges alternately upon said substrate and said non-reflective mounting means so as to produce a reflected light received by said sensing means at intervals determined according to the rate of rotation of said rotatable mounting means.

9. A vapor deposition apparatus as set forth in claim 8 wherein a beam of light has an angle of incidence on said surface of said substrate which is near but not equal to 90 degrees.

10. An apparatus for controlled deposition of a thin film of material on a substrate comprising:

a chamber capable of enclosing a substrate having a deposition surface upon which a thin film of material is to be deposited, said chamber being capable of confining an atmosphere which is a source of the material to be deposited, and having a wall in which at least one light-transmissive window is disposed, rotatable mounting means disposed within said chamber and having a mounting surface upon which said substrate is mounted, a light source for emitting light at a wavelength capable of being reflected by said substrate and by said material to be deposited;

means for forming an incident beam of said light and directing said beam through said window and onto said deposition surface, said beam being directed substantially normal to said deposition surface whereby light from said incident beam is reflected from said deposition surface and returns through said window as a reflected beam;

means for measuring the intensity of said reflected beam;

means for rotating said rotatable mounting means whereby said incident beam impinges alternately on said deposition surface of said substrate and said mounting surface of said mounting means, said mounting surface being essentially non-reflective of said incident beam at said wavelength.

11. The apparatus of claim 10 additionally comprising:

data acquisition means for detecting said reflected beam when present, measuring the intensity of said reflected beam, and deriving from said intensity measurement a growth parameter of said film;

control means for controlling the rate of deposition or composition of said material forming said film.

12. The apparatus of claim 11 wherein a plurality of substrates are mounted on said mounting surface of said rotatable mounting means and are illuminated in turn by said incident beam when the mounting means rotates, whereby a plurality of reflected beams is generated, each individual substrate of said plurality of substrates generating its own individual reflected beam, and said data acquisition means is capable of correlating each individual reflected beam with its individual substrate and deriving from said individual reflected beam a growth parameter for the film deposited on its substrate.

13. The apparatus of claim 12 comprising a plurality of said light-transmissive windows, each being provided with said source of light, said incident beam forming means and means for measuring the intensity of said reflected beam.

* * * * *